(12) United States Patent
Kuder et al.

(10) Patent No.: US 8,974,705 B2
(45) Date of Patent: Mar. 10, 2015

(54) SINTERABLE SILVER FLAKE ADHESIVE FOR USE IN ELECTRONICS

(71) Applicants: Henkel AG & Co. KGaA, Duesseldorf (DE); Henkel Corporation, Rocky Hill, CT (US)

(72) Inventors: Harry Richard Kuder, Fullerton, CA (US); Juliet Grace Sanchez, Carson, CA (US); Xinpei Cao, Cambridge (GB); Matthias Grossmann, Aschaffenburg (DE)

(73) Assignees: Henkel AG & Co. KGaA, Duesseldorf (DE); Henkel IP & Holding GmbH, Duesseldof (DE)

( * ) Notice: Subject to any disclaimer, the term of this patent is extended or adjusted under 35 U.S.C. 154(b) by 0 days.

(21) Appl. No.: 13/799,002

(22) Filed: Mar. 13, 2013

(65) Prior Publication Data

US 2013/0187102 A1   Jul. 25, 2013

Related U.S. Application Data

(63) Continuation of application No. PCT/US2011/065336, filed on Dec. 16, 2011.

(60) Provisional application No. 61/446,575, filed on Feb. 25, 2011.

(51) Int. Cl.
| | |
|---|---|
| *H01B 1/02* | (2006.01) |
| *H01B 1/22* | (2006.01) |
| *C09J 9/02* | (2006.01) |
| *C09J 11/02* | (2006.01) |
| C08K 5/14 | (2006.01) |
| C08K 7/06 | (2006.01) |
| C08K 3/08 | (2006.01) |

(52) U.S. Cl.
CPC ... *C09J 9/02* (2013.01); *C08K 5/14* (2013.01); *H01L 2924/01322* (2013.01); *C08K 7/06* (2013.01); *C08K 3/08* (2013.01); *H01L 2924/13055* (2013.01); *C09J 11/02* (2013.01); *H01B 1/22* (2013.01); *H01L 2224/29339* (2013.01)
USPC ............................................................ 252/514

(58) Field of Classification Search
CPC .......... H01B 1/02; H01B 1/22; B22F 1/0055; B22F 1/0007; B22F 1/0059; C09D 5/24; C09D 7/1291; C09D 11/52; H05K 9/0092; H05K 1/092; H05K 2201/0245
USPC ........... 252/514; 106/1.19; 524/439; 427/125
See application file for complete search history.

(56) References Cited

U.S. PATENT DOCUMENTS

| | | | |
|---|---|---|---|
| 6,036,889 A * | 3/2000 | Kydd | 252/512 |
| 2002/0062923 A1 * | 5/2002 | Forray | 156/307.1 |
| 2006/0289837 A1 | 12/2006 | McNeilly et al. | |
| 2007/0170403 A1 * | 7/2007 | Conaghan et al. | 252/514 |
| 2007/0181858 A1 | 8/2007 | Matsushima et al. | |
| 2009/0236404 A1 | 9/2009 | Yamakawa et al. | |
| 2010/0243967 A1 | 9/2010 | Hisaeda et al. | |
| 2010/0285233 A1 * | 11/2010 | Brasseur et al. | 427/511 |
| 2011/0039018 A1 * | 2/2011 | Brown et al. | 427/58 |
| 2012/0153011 A1 | 6/2012 | Schaefer et al. | |
| 2012/0153012 A1 | 6/2012 | Schaefer et al. | |

* cited by examiner

*Primary Examiner* — Mark Kopec
(74) *Attorney, Agent, or Firm* — Steven C. Bauman

(57) ABSTRACT

A conductive composition comprises (i) micro- or submicro-sized silver flake having a tap density of 4.6 g/cc or higher and (ii) a solvent that dissolves any fatty acid lubricant or surfactant present on the surface of the silver. In one embodiment, (iii) a small amount of peroxide is present. No organic resin is present in the composition.

13 Claims, No Drawings

SINTERABLE SILVER FLAKE ADHESIVE FOR USE IN ELECTRONICS

BACKGROUND OF THE INVENTION

Conductive adhesive compositions comprising an adhesive resin and a conductive filler are used in the fabrication and assembly of semiconductor packages and microelectronic devices, both to mechanically attach, and to create electrical conductivity between, integrated circuit devices and their substrates. The most commonly used conductive filler is silver flake. The adhesive resin can be chosen from a wide variety of resins known in the art for this purpose. The resin is needed because the silver flake typically used is not sufficiently adhesive to adhere the integrated circuit device to its substrate. The presence of the resin, however, limits the high thermal and electrical conductance of the silver.

Work has been done on conductive adhesive compositions containing no adhesive resins and only nano-silver as both the conductive agent and the adhering agent. Although nano-silver can sinter at temperatures lower than conventional silver flake because it has a higher surface area, it remains porous when sintered at those low temperatures. The presence of pores can cause voids in the conductive composition, which can lead to failure of the semiconductor or microelectronic device in which the conductive composition is used. Thus, nano-silver must be sintered at high heat and pressure to eliminate pores and attain sufficient densification in order to be suitable for use in semiconductor manufacture.

The present invention gives enhanced conductivity in high power devices as a replacement for solder in conventional semiconductor assembly, and provides an alternative to the typical conductive adhesive compositions comprising conventional silver flake and adhesive resin and to compositions containing only nano-silver that must be sintered with pressure.

SUMMARY OF THE INVENTION

This invention is a conductive composition comprising (i) micro- or submicro-sized silver flake having a tap density of 4.6 g/cc or higher and (ii) a solvent that dissolves any fatty acid lubricant or surfactant present on the surface of the silver. In one embodiment, (iii) a small amount of peroxide is present. No organic resin is present in the composition.

DETAILED DESCRIPTION OF THE INVENTION

Most silver flake is provided commercially with a coating of a fatty acid lubricant and surfactant to prevent agglomeration. The lubricant and surfactant can hinder sintering, which means that higher temperatures would be needed for sintering. The solvent of the inventive conductive composition acts to dissolve or displace the lubricant and surfactant off the surface of the silver flake. The solvent must have a balance of polarity effective to remove the coatings and allow the silver to remain dispersed in the solvent until dispensed and sintered. Typical lubricants used by manufacturers of silver flake include stearic acid, isostearic acid, lauric acid, decanoic acid, oleic acid, palmitic acid, or fatty acids neutralized with amines such as imidazoles. An effective solvent is one that will remove these, and other such, lubricants from the surface of the silver flake.

In one embodiment the solvent is selected from the group consisting of 2-(2-ethoxy-ethoxy)-ethyl acetate, propylene glycol monoethyl ether, butylethoxy ethyl acetate, and propylene carbonate. Other suitable solvents include cyclic ketones, such as cyclooctanone, cycloheptanone, and cyclohexanone, and linear or branched alkanes. The solvent is present in an amount less than 15% by weight of the total composition. Alternative alcohol solvents, such as terpineol and 2-octanol, are effective in lubricant removal from the silver surface, but do not give a usable work life because the silver flakes settle out of solution rapidly.

Thus, in one embodiment, this invention is a conductive composition comprising silver flake having a tap density of 4.6 g/cc or higher and a solvent effective to dissolve any coatings on the silver flake. No adhesive resin is present in the composition. In one embodiment the tap density of the silver flake is 4.9 g/cc or higher; in another embodiment the tap density of the silver flake is 5.2 g/cc or higher.

If sintering is to take place under a nitrogen atmosphere (such as would be necessary when a copper substrate is used), liquid peroxides are added to the composition to introduce oxygen, which helps in the removal of the lubricant and surfactant. Liquid peroxides are preferred to control rheology and silver settling. Examples of suitable liquid peroxides are selected from the group consisting of tertiary-butyl peroxy-2-ethylhexanoate, tertiary-butyl peroxyneodecanoate, dilauroyl peroxide, tertiary-butyl peroctoate, 1,1,3,3-tetramethyl-butyl peroxy-2-ethyl hexanoate, di-tertiary-butyl peroxide, 2,5-bis-(tertiary-butylperoxy)-2,5-dimethyl hexane, and di-tertiary-amyl peroxide. In one embodiment, the peroxide is present in an amount of 0.2 to 0.5% by weight of the total composition. In a further embodiment, the peroxide is present in an amount of 0.1 to 1.0% by weight of the total composition.

In a further embodiment, this invention is a conductive composition comprising silver flake having a tap density of 4.6 g/cc or higher; a solvent effective to dissolve any coatings on the silver flake; and a liquid peroxide. No adhesive resin is present in the composition. In another embodiment the tap density of the silver flake is 4.9 g/cc or higher; in a further embodiment the tap density of the silver flake is 5.2 g/cc or higher. In yet another embodiment the tap density is as high as 7.4 g/cc.

When used in semiconductor fabrication, these compositions have sufficient adhesion upon sintering without the use of any organic resin to adhere metal coated dies to metal coated substrates. In some embodiments the compositions of this invention will sinter at temperatures under 250° C. In other embodiments, the compositions of this invention will sinter at temperatures under 200° C. At sintering temperatures, the lubricant, surfactant, solvent, and any peroxide are burned off leaving only the sintered silver.

Various cure schedules can be devised to suit the needs of the practitioner. Lower temperature and longer time period sintering profiles may be needed for large size dies, so that the solvent is more gradually removed, thereby assuring void free bond lines. Typical sintering profiles are given here, although it should be understood that other similar sintering profiles are anticipated to be equally effective. Examples of sintering profiles include:

a 30 minute ramp from room temperature to 220° C., followed by a 60 minute hold at 220° C.;

a 15 minute ramp from room temperature to 110° C., followed by a 60 minute hold at 110° C., followed by a 60 minute hold at 240° C.;

a 30 minute ramp from room temperature to 250° C., followed by a 60 minute hold at 250° C.;

at a higher sintering temperature, a 60 minute ramp to 300° C., followed by a two hour hold at 300° C.

No pressure is needed to accomplish the sintering of the compositions of this invention with these sintering profiles.

Using gold and silver coated dies to metal coated copper leadframes with silver or nickel-palladium-gold flash as the test vehicles, these sintering profiles achieved thermal conductivity of greater than 100 W/m° K., and die shear strength of greater than 1.0 Kg/mm2 at room temperature and ≥0.5 Kg/mm2 at less than 270° C. Within the industry, acceptable targets for compositions with silver flake having a tap density of ≥4.2 g/cc ≤4.0×10-5 ohm-cm for volume resistivity, ≥40 W/m° K. for thermal conductivity, ≥1.0 kg/mm2 for die shear strength at 25° C., and ≥0.5 Kg/mm2 die shear strength at 270° C.

The adhesives of this invention will find utility to increase power density in packages such as TO, SO, MLP, WLCSP, BGA, IGBT, and LED for semiconductor, automotive, high voltage, and cSi Cell applications. These are typical assembly packages to the electronic industry.

EXAMPLES

In the following examples, die shear strength was measured using a Dage 4000 series Die Shear Tester having a heater adapter plate capable of reaching 350° C. and achieving at least 50 kg force. The test dies were 3.81 mm×3.81 mm, metalized with nickel palladium and coated with a flash of gold on the back sides. The test substrates were silver-coated copper leadframes. The test sample was silver adhesive. The silver adhesive was dispensed onto the leadframe and a die placed manually onto the silver adhesive. The silver adhesive between the die and leadframe was sintered according to the sintering profile stated for the individual example. No pressure was applied during sintering. The sintering attached the die to the leadframe and this assembly was tested for die shear.

In the following examples, volume resistivity was measured using an Agilent 34401A digital multimeter or Gen Rad 1689 Precision RLC Digibridge. The test sample was a specimen of 50 microns×0.25-mm×25.4-mm of silver adhesive sintered to a glass slide according to the sintering profile stated in the individual example. A minimum of three samples were tested multiple times for validation and repeatability and the results pooled and averaged.

In the following examples, thermal conductivity was measured using a Micro Flash-Laser Thermal Properties Instrument. The test samples were free-standing silver adhesive discs, 0.5-mm×12.7-mm, sintered according to the sintering profile stated in the individual example. A minimum of two samples were tested multiple times for validation and repeatability and the results pooled and averaged.

For Examples 1-6, the sintering profile consisted of a 30 minute ramp from room temperature to 250° C., followed by a hold for 60 minutes at 250° C. No pressure was used.

Example 1

Properties for silver adhesive samples containing silver flake at 88.1% weight percent (wt %) (tap density of 5.7 g/cc), propylene carbonate at 11.5 wt % (solvent), and tertiary-butyl peroxy-2-ethylhaxanoate (peroxide) at 0.4% weight percent (wt %) were tested as described above. The results are reported here:

| | Results: |
|---|---|
| Tap density of silver flake | 5.7 g/cc |
| Volume Resistivity | $1.3 \times 10^{-5}$ ohm-cm |
| Thermal Conductivity | 94.6 W/m° K |
| Die Shear Strength @ 25° C. | 1.6 kg/mm$^2$ |
| Die Shear Strength @ 270° C. | 1.4 kg/mm$^2$ |

Example 2

Thermal conductivity for silver adhesive samples containing silver flake with a tap density of 5.7 g/cc, and different solvents, was tested as described above. The results are reported here:

| | | | |
|---|---|---|---|
| Silver flake with tap density 5.7 g/cc | 91.1 wt % | 88.5 wt % | 91.8 wt % |
| Solvent: 2-(2-Ethoxy-ethoxy)-ethyl acetate | 9.9 wt % | — | 4.6 wt % |
| Solvent: propylene carbonate | — | 11.5 wt % | — |
| Solvent: cyclooctanone | | | 3.6 wt % |
| Thermal Conductivity | 110.9 W/m° K | 94.6 W/m° K | 119.8 W/m° K |

Example 3

Thermal conductivity for silver adhesive samples containing silver flake with a tap density of 5.7 g/cc, propylene carbonate as solvent, and various peroxides, was tested as described above. The results are reported here:

| | | | | |
|---|---|---|---|---|
| Silver flake with tap density 5.7 g/cc | 88.5 wt % | 88.5 wt % | 88.5 wt % | 88.5 wt % |
| Solvent: propylene carbonate | 11.5 wt % | 11.5 wt % | 11.5 wt % | 11.5 wt % |
| Peroxide: tertiary-butyl peroxyneodecanoate | 0.4 wt % | | | |
| Peroxide: tertiary-butyl peroxy-2-ethylhexanoate | | 0.4 wt % | | |
| Peroxide: di-tertiary-butyl peroxide | | | 0.4 wt % | |
| Peroxide: 2,5-bis-(tertiary-butylperoxy)-2,5-dimethyl hexane | | | | 0.4 wt % |
| Thermal Conductivity | 59.9 W/m° K | 98.0 W/m° K | 109.7 W/m° K | 104.7 W/m° K |

Example 4

Thermal conductivity for silver adhesive samples containing silver flake with a tap density of 5.7 g/cc, propylene carbonate as solvent, and peroxides in varying concentrations, was tested as described above. The results are reported here:

| | | | |
|---|---|---|---|
| Silver flake with tap density 5.7 g/cc | 91.7 wt % | 91.5 wt % | 91.0 wt % |
| Solvent: propylene carbonate | 3.6 wt % | 3.6 wt % | 3.6 wt % |
| Peroxide: 2-(2-ethoxy-ethoxy)-ethyl acetate | 4.5 wt % | 4.5 wt % | 4.5 wt % |
| Peroxide: 2,5-bis-(tertiarybutylperoxy)-2,5-dimethyl hexane | 0.2 wt % | 0.4 wt % | 0.9 wt % |
| Thermal Conductivity | 75.0 W/m° K | 74.7 W/m° K | 65.7 W/m° K |

Example 5

Properties for silver adhesive samples containing silver flake with varying tap densities at 88.1 wt %, propylene carbonate (solvent) at 11.8 wt %; tertiary-butyl peroxy-2-ethylhexanoate (peroxide) at 0.4 wt %, were tested as described above. The results are reported here:

| Tap density of silver flake | 4.9 g/cc | 5.2 g/cc | 5.7 g/cc | 7.4 g/cc |
|---|---|---|---|---|
| Volume Resistivity | $2.0 \times 10^{-5}$ ohm-cm | $2.3 \times 10^{-5}$ ohm-cm | $1.3 \times 10^{-5}$ ohm-cm | $1.4 \times 10^{-5}$ ohm-cm |
| Thermal Conductivity | 99.9 W/m° K | 92.1 W/m° K | 94.6 W/m° K | |
| Die Shear Strength @ 270° C. | 1.4 kg/mm² | 1.6 kg/mm² | 1.6 kg/mm² | |

Example 6

Properties for silver adhesive samples containing silver flake with various fatty acid lubricants were tested as described above. The tap density of the silver flake varied depending on the lubricant used to mill the silver powder. The silver adhesives contained silver flake at 88.1 wt %, propylene carbonate (solvent) at 11.5 wt %, and tertiary-butyl peroxy-2-ethylhexanoate (peroxide) at 0.4 wt %. The results are reported here:

| Silver milling lubricant | Stearic acid | Lauric acid | Decanoic acid |
|---|---|---|---|
| Tap Density of Silver Flake | 5.7 | 5.5 | 5.2 |
| Volume Resistivity | $1.5 \times 10^{-5}$ ohm-cm | $1.7 \times 10^{-5}$ ohm-cm | $1.7 \times 10^{-5}$ ohm-cm |
| Thermal Conductivity | 109.7 W/m° K | 71.1 W/m° K | 93.2 W/m° K |
| Die Shear Strength @ 25° C. | 1.6 kg/mm² | 0.4 kg/mm² | 1.7 kg/mm² |
| Die shear strength @ 270° C. | 1.2 kg/mm² | 0.7 kg/mm² | 1.3 kg/mm² |

Example 7

Silver adhesive samples containing silver flake (tap density 5.7 g/cc) at 88.1 wt %, propylene carbonate (solvent) at 11.5 wt %, and tertiary-butyl peroxy-2-ethylhexanoate (peroxide) at 0.4 wt % were subjected to various sintering profiles consisting of a 30 minute ramp from room temperature to the maximum temperature listed in the table below, followed by holding for 60 minutes at the maximum temperature. The properties of the samples were measured as described above and are reported here:

| Sintering profile, max. temperature | 175° C. | 200° C. | 220° C. | 250° C. |
|---|---|---|---|---|
| Volume resistivity | $1.3 \times 10^{-5}$ ohm-cm | $1.3 \times 10^{-5}$ ohm-cm | $1.3 \times 10^{-5}$ ohm-cm | $1.2 \times 10^{-5}$ ohm-cm |
| Thermal conductivity | Not able to test | 55.1 W/m° K | 101.8 W/m° K | 99.5 W/m° K |
| Die shear strength @ 25° C. | 0.2 kg/mm² | 1.1 kg/mm² | 1.8 kg/mm² | 1.7 kg/mm² |
| Die shear strength @ 270° C. | 0.1 kg/mm² | 1.3 kg/mm² | 1.4 kg/mm² | 1.4 kg/mm² |

Example 8

Samples of silver adhesives containing no solvent or peroxide were tested by DSC in air and in nitrogen to confirm sintering potential at 10° C./minute ramp. The larger the heat of reaction, the greater is the potential for silver sintering and densification. A heat of reaction in air or nitrogen of greater than 19 J/g demonstrated sintering potential with stearic acid, lauric acid, decanoic acid, stearic acid with lauric acid eutectic blend, and stearic aicd neutralized with imidazole. A heat of reaction less than 19 J/g does not sinter sufficiently, particularly in an nitrogen environment.

| Silver lubricant | Tap density g/cc | DSC in Air Onset temp | DSC in Air Peak temp | DSC in Air Heat of Reaction | DSC in Nitrogen Onset temp | DSC in Nitrogen Peak temp | DSC in Nitrogen Heat of Reaction | Sinter potential |
|---|---|---|---|---|---|---|---|---|
| Stearic acid | 7.4 | 184° C. | 234° C. | 27 J/g | 212° C. | 269° C. | 24 J/g | Yes |
| | 5.7 | 182° C. | 236° C. | 45 J/g | 195° C. | 344° C. | 41 J/g | Yes |
| | 5.2 | 194° C. | 254° C. | 54 J/g | 203° C. | 261° C. | 19 J/g | Yes |
| | 4.6 | 170° C. | 269° C. | 50 J/g | 183° C. | 286° C. | 46 J/g | Yes |
| Stearic-imidazole | 5.7 | 240° C. | 242° C. | 28 J/g | 249° C. | 251° C. | 23 J/g | Yes |
| Stearic-lauric blend | 5.6 | 208° C. | 251° C. | 33 J/g | 212° C. | 281° C. | 29 J/g | Yes |
| Lauric acid | 5.6 | 211° C. | 215° C. | 32 J/g | 198° C. | 318° C. | 28 J/g | Yes |
| Decanoic acid | 5.2 | 208° C. | 240° C. | 31 J/g | 219° C. | 291° C. | 27 J/g | Yes |
| Isostearic acid | 5.1 | 190° C. | 254° C. | 28 J/g | 199° C. | 226° C. | 0.5 J/g | No |
| Palmitic acid | 5.2 | 164° C. | 207° C. | 6 J/g | 217° C. | 240° C. | 1.9 J/g | No |
| Oleic acid | 6.7 | 251° C. | 254° C. | 26.5 J/g | 210° C. | 242° C. | 0.3 J/g | No |

What is claimed:

1. A conductive composition consisting essentially of:
   (i) micro- or submicro-sized silver flake having a tap density of 4.6 g/cc or higher and
   (ii) a solvent that dissolves any fatty acid lubricant or surfactant present on the surface of the silver.

2. The conductive composition according to claim 1 in which the silver flake has a tap density of 4.9 g/cc or higher.

3. The conductive composition according to claim 1 in which the silver flake has a tap density of 5.2 g/cc or higher.

4. The conductive composition according to claim 1 in which the solvent is present in an amount less than 15% by weight of the total composition.

5. The conductive composition according to claim 1 in which the solvent is selected from the group consisting of 2-(2-ethoxy-ethoxy)-ethyl acetate, propylene glycol monoethyl ether, butylethoxy ethyl acetate, propylene carbonate, cyclooctanone, cycloheptanone, cyclohexanone, and linear or branched alkanes.

6. A conductive composition comprising
   (i) micro- or submicro-sized silver flake having a tap density of 4.6 g/cc or higher,
   (ii) a solvent that dissolves any fatty acid lubricant or surfactant present on the surface of the silver, and
   (iii) a liquid peroxide.

7. The conductive composition according to claim 6 in which the liquid peroxide is selected from the group consisting of tertiary-butyl peroxy-2-ethylhexanoate, tertiary-butyl peroxyneodecanoate, dilauroyl peroxide, tertiary-butyl peroctoate, 1,1,3,3-tetramethylbutyl peroxy-2-ethyl hexanoate, di-tertiary-butyl peroxide, 2,5-bis-(tertiary-butylperoxy)-2,5-dimethyl hexane, and di-tertiary-amyl peroxide.

8. The conductive composition according to claim 6 in which the liquid peroxide is present in an amount of 0.2 to 0.5% by weight of the total composition.

9. The conductive composition according to claim 6 in which the liquid peroxide is present in an amount of 0.1 to 1.0% by weight of the total composition.

10. The conductive composition according to claim 6 in which the silver flake has a tap density of 4.9 g/cc or higher.

11. The conductive composition according to claim 6 in which the silver flake has a tap density of 5.2 g/cc or higher.

12. The conductive composition according to claim 6 in which the solvent is present in an amount less than 15% by weight of the total composition.

13. The conductive composition according to claim 6 in which the solvent is selected from the group consisting of 2-(2-ethoxy-ethoxy)-ethyl acetate, propylene glycol monoethyl ether, butylethoxy ethyl acetate, propylene carbonate, cyclooctanone, cycloheptanone, cyclohexanone, and linear or branched alkanes.

* * * * *